United States Patent [19]
Parisoe

[11] 4,005,369
[45] Jan. 25, 1977

[54] AC LINE MULTIPLEXING FOR A MULTI-DIGIT DISPLAY SYSTEM

[75] Inventor: Wilbert Parisoe, Highland Park, Ill.

[73] Assignee: Zenith Radio Corporation, Chicago, Ill.

[22] Filed: Aug. 4, 1975

[21] Appl. No.: 601,562

[52] U.S. Cl. .............................................. 325/455
[51] Int. Cl.² .......................................... H04B 1/16
[58] Field of Search ............... 325/455; 340/324 M, 340/336, 334, 339, 325; 58/50 R, 23 R, 23 BA

[56] References Cited
UNITED STATES PATENTS

| | | | |
|---|---|---|---|
| 3,699,763 | 10/1972 | Zeph | 58/50 R |
| 3,728,714 | 4/1973 | Kolesar | 340/334 |
| 3,813,575 | 5/1974 | Webb | 340/336 |
| 3,835,424 | 9/1974 | Marik | 325/455 |
| 3,846,707 | 11/1974 | Sakamoto | 325/453 |
| 3,851,254 | 11/1974 | Merrell et al. | 325/455 |
| 3,867,619 | 2/1975 | Arauchi | 58/50 R |
| 3,906,345 | 9/1975 | Bertolasi | 340/325 |

*Primary Examiner*—Robert L. Griffin
*Assistant Examiner*—Michael A. Masinick
*Attorney, Agent, or Firm*—Nicholas A. Camasto

[57] ABSTRACT

A two digit display system includes an AC line operated transformer with a center tapped secondary supplying a pair of diodes to produce half wave rectified voltages 180° out-of-phase for alternately activating two 7-segment digital display devices. One half wave voltage is reshaped and supplied to a multiplexing circuit for alternately supplying, in synchronism with the corresponding display device activation, BCD information from separate tens and units storage devices to a single decoder-driver for conversion of the BCD information into digital information for display.

5 Claims, 1 Drawing Figure

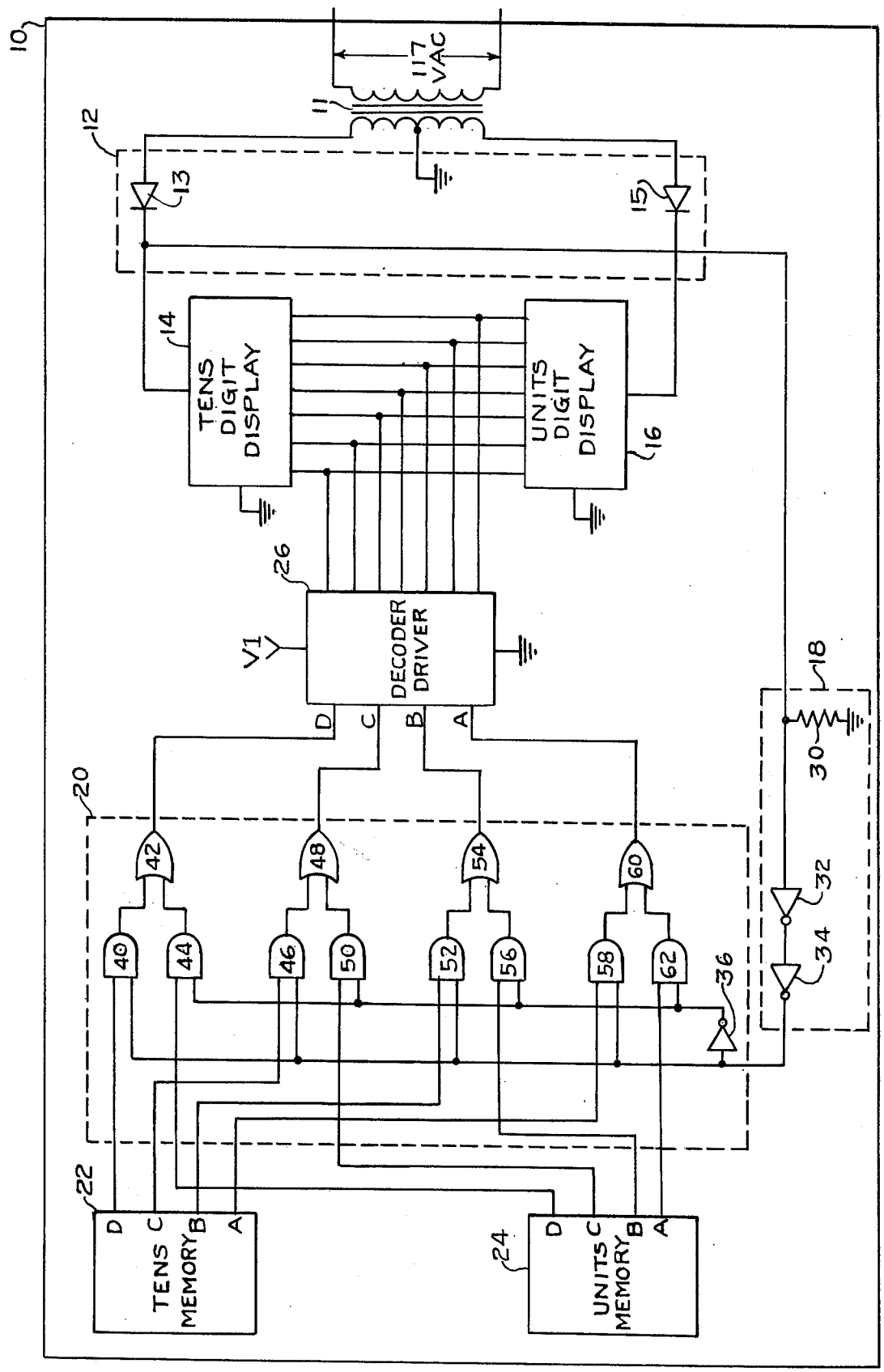

AC LINE MULTIPLEXING FOR A MULTI-DIGIT DISPLAY SYSTEM

CROSS REFERENCE TO RELATED PATENT APPLICATIONS

This application is related to the following applications all of which are assigned to the assignee of the present application and all of which are hereby incorporated by reference. Ser. No. 326,724, filed Jan. 26, 1973, Pat. No. 3,851,254, issued Nov. 26, 1974, entitled "Digital Systems and Method for Determining and Displaying a Television Channel Number, " in the names of Richard G. Merrell and Akio Tanaka, and Ser. No. 430,446, filed Jan. 3, 1974, now U.S. Pat. No. 3,961,266, issued June 1, 1976, entitled "Channel Seeking Tuning System" in the name of Akio Tanaka.

BACKGROUND OF THE INVENTION

The invention is concerned with time shared numeric display systems. Specifically, the invention is directed to displaying two digit channel numbers on a television receiver. Application Ser. No. 430,446 shows a display system employing separate memories coupled respectively to individual decoders for constantly displaying the information stored in the memories. This invention provides a novel improvement for this and other display systems.

Time sharing of numeric display units is well known in the art. Generally a single decoder is time shared for decoding information to be supplied to the positions in the display device. The positions are illuminated one at a time but fast enough to appear flicker-free. If the time sharing or strobe rate is approximately 50 per second, the eye does not detect any flicker. The advantages of time sharing are that less power is consumed because of non constant operation and a single decoder-driver may be used.

Normally, supplying information to a single decoder is achieved by a multiplexing of the information. In multiplex operations, a series of memories may contain binary coded decimal (BCD) information to be displayed. A clocking system sequentially activates the output terminals of the memories to supply their information to the common decoder which generates decimal information for display. Thus on a time sequenced basis the information for display is multiplexed to the decoder. The clocking system simultaneously selectively activates corresponding display devices thus the information in the various memories is sequentially decoded and supplied to a display device on a regular time sequenced basis at a rate for which the usual display appears to be continuous. The design of the clocking system is usually dictated by the type of display device and the number of digits to be displayed. This invention takes advantage of the AC line frequency, normally supplied to an appliance, to produce clock signals and provide a greatly simplified two digit display system.

OBJECTS OF THE INVENTION

An object of this invention is to provide a novel multi-digit display system.

Another object of this invention is to provide an improved display system for AC powered electrical appliances.

SUMMARY OF THE INVENTION

In accordance with the invention an electrical appliance derives power from an AC line and includes a multi-digit display system which comprises a plurality of display devices corresponding to individual digits, circuit means generating line frequency related timing pulses for selectively activating individual display devices, a source of digital information, and multiplex means coupled to the source for selectively supplying digital information in synchronism with the activation of corresponding individual display devices.

BRIEF DESCRIPTION OF THE DRAWING

The single FIGURE shows the detailed circuitry of the preferred embodiment of the invention with functional segments enclosed by broken lines.

DESCRIPTION OF THE PREFERRED EMBODIMENT

A single decoder-driver is employed to supply to individual display devices decoded digital information. This decoder-driver operates continuously and the source of information supplied to its input terminals is sequentially alternated between a units memory and tens memory. Thus the information is multiplexed to the decoder-driver. A plurality of identical pairs of AND gates coupled to OR gates form the basic circuitry for achieving this multiplexing or time sharing operation. An AC line derived clock enables corresponding ones of the pairs to allow information from the selected memory to be supplied to the decoder-driver while at the same instant the AC line derived clock activates the appropriate display device.

The FIGURE depicts a television receiver or other electrical appliance indicated by a block 10 which is powered by an AC line coupled to a transformer 11. The secondary winding of the transformer is connected to rectifying means, indicated by a dashed line box 12, producing two 180° phase displaced half-wave rectified AC voltages. Rectifying means 12 supplies signals to a tens digit display 14, to a units digit display 16, and to wave shaping circuit 18 (indicated by a dashed line box). Wave shaping circuit 18 is coupled to multiplex means 20 (indicated by a dashed line box) which accepts digital information stored in a tens memory 22 and a units memory 24. These memories provide a source of digital information. The outputs of multiplex means 20 are coupled to a decoder-driver 26 which has a plurality of interconnections with tens display 14 and units digit display 16. The display units display the digital information stored in the corresponding memories on a multiplex or time shared basis.

More specifically, transformer 11 has a grounded center tapped secondary winding supplying reduced AC voltages to a pair of diodes 13 and 15 in rectifying means 12. Diode 13 is connected between one end terminal of the secondary winding of transformer 11 and the activation input of tens digit display 14 and diode 15 is connected between the opposite end terminal of the secondary winding and the power supply input of units digit display 16. The output of diode 13 is also connected to a resistor 30, having its other terminal connected to ground, and to a pair of inverters 32 and 34 connected in series. The arrangement of resistor 30 provides a path for leakage of charge buildup due to parasitic capacitance in the high impedance inverters. It will be recognized that resistor 30 and inverters 32 and 34 form a wave shaping network converting half-wave rectified voltages from diode 13 into a square wave voltage of the same phase and frequency.

The output of inverter 34 is coupled to first inputs of a plurality of AND gates (hereafter referred to simply as an AND or AND's) 40, 46, 52 and 58 and through an inverter 36 to first inputs of AND's 44, 50, 56 and 62. Units memory 24 has four output terminals labelled A, B, C and D corresponding to the binary coded representation (in increasing powers of 2) of the units digit. The A, B, C and D terminals of units memory 24 are connected to second inputs respectively of AND's 62, 56, 50 and 44. Similarly, tens memory 22 has A, B, C and D output terminals connected respectively to second inputs of AND's 58, 52, 46 and 40. The outputs of AND's 40 and 44 are connected to the inputs of an OR gate (hereafter referred to simply as an OR or OR's) 42; the outputs of AND's 46 and 50 are connected to the inputs of an OR 48; the outputs of AND's 52 and 56 are connected to the inputs of an OR 54; and the outputs of AND's 58 and 62 are connected to the inputs of an OR 60.

The output of OR's 60, 54, 48 and 42 are coupled respectively to the A, B, C and D input terminals of decoder-driver 26. Decoder-driver 26 is shown connected between a DC voltage terminal V1 and ground and its seven outputs are coupled to corresponding inputs of tens digit display 14 and units display 16. Decoder-driver 26 functions to convert the BCD information from either memory into corresponding signals to provide a coded representation of the corresponding digit. Tens digit display 14 and units digit display 16 may thus be well known as 7-segment devices for providing visual representation of the digits 0–9. It will be appreciated that a variety of decoder-drivers may be used in conjunction with other forms of display devices.

In operation, 117 volts AC power is applied to the primary winding of transformer 11. The terminals of the center tap grounded secondary are attached to diodes 13 and 15 for providing two half-wave rectified AC voltages 180° out-of-phase. Thus, the positive portion of one voltage corresponds to the zero portion of the other. These voltages when individually applied to the tens and units digit displays provide alernative activation of the display devices which do not display information unless activated. The decoder-driver converts the BCD information supplied to it into coded representation for display. It may be seen that while decoder-driver 26 supplies the same information to both display units only the one which has been activated can display information.

The half-wave rectified voltage from diode 13 is formed into a square wave shaper 18 and used as a clock signal. The square wave pulse signal at the output of inverter 34 alternately enables the group of AND's corresponding to the tens and units memories. The non-zero portion of the square wave from wave shaper 18 may be considered as having a 1 logic voltage level which enables AND's 40, 46, 52 and 58 while the corresponding 0 level (opposite of logic 1 level) at the output of inverter 36 inhibits AND's 44, 50, 56 and 62. When the AND's for the tens memory are enabled those corresponding to the units memory are inhibited which permit the BCD information in tens memory 22 only to be supplied to decoder-driver 26, through OR's 42, 48, 54 and 60. Similarly, the output of wave shaper 18 is at 0, AND's 44, 50, 56 and 62 are enabled and AND's 40, 46, 52 and 58 are inhibited thus permitting only units information to be supplied to decoder-driver 26.

It will be appreciated that many forms of memory units or memory cores may be used and it is not necessary to retain information in BCD form. And as an example, four word, 8-bit capacity memory modules, such as those designated by RCA by number CD4036AE may be used as units and tens memories. No provision for loading the memories is shown since this is not part of the invention.

Decoder-driver 26 converts the information stored in the memories to a specific signal to generate a visual indication of that information. While many decoder-drivers and display combinations may be used, Signetics number N7447 BCD decoder-driver and a Litronix number DL727 7-segment display were used in the actual circuit. The Sperry Corporation markets a suitable combination under Model Nos. DD700 and SP752.

Multiplexer 20 assures that information is displayed in the appropriate display device. Information corresponding to the units memory for example is supplied through decoder-driver 26 to the units and tens display devices simultaneously with an activation voltage from diode 15. Although tens display device 14 receives the decoded signal from decoder-driver 26 it is not activated. Thus, the units information is displayed in the units display. Similarly, tens memory information is decoded by decoder-driver 26 and supplied to tens digit display 14 in time coincidence with activation of tens digit display device by the voltage from diode 13. Thus, the AC line frequency is employed as a form of external clock to multiplex the digit display devices.

What has been shown is a novel multi-digit display system for electrical appliances utilizing AC power. The AC signal is utilized to provide time sharing among several digits at a rate which is fast enough so that flicker can not be observed. This invention provides cost savings by a reduction of the number of parts necessary and a reduction in the power consumption for the displays.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. In a television receiver deriving power from a single phase source of AC line voltage, a multi-digit display system comprising:
    a pair of display devices corresponding to the tens and units digits of two digit channel numbers;
    circuit means including rectification means utilizing the positive and negative portions of said single phase AC line voltage to generate two half-wave rectified AC timing voltages 180° out-of-phase for selective activation of said two display devices;
    a source of digital information; and
    multiplex means coupled to said source of digital information for supplying said digital information in synchronism with the activation of individual ones of said tens and units display devices.

2. The multi-digit display system of claim 1 wherein said source of digital information includes means for storing binary coded decimal information and said multiplex means includes decoding means for converting said BCD informaton unto digital information for display.

3. The multi-digit display system of claim 2 further including wave shaping means coupled between said rectification means and said multiplex means accepting one of said half-wave rectified AC voltages and generating synchronizing timing voltages for said multiplex means.

4. The multi-digit display system of claim 3 wherein said means for storing binary coded digital information comprises a tens memory and a units memory, representing the corresponding digits of said two digit channel numbers, and said decoding means comprises a decoder-driver, coupled between said multiplex means and said pair of display devices, for converting said binary coded decimal information into digital information for display.

5. The multi-digit display system of claim 4 wherein said pair of display devices comprise two 7-segment character display devices coupled to receive individual ones of said two half-wave rectified AC voltages.

* * * * *